United States Patent [19]

Pfiester et al.

[11] Patent Number: 5,141,895
[45] Date of Patent: Aug. 25, 1992

[54] SEMICONDUCTOR DEVICE PROCESS USING DIFFUSANT PENETRATION AND SOURCE LAYERS FOR SHALLOW REGIONS

[75] Inventors: James R. Pfiester; Howard C. Kirsch, both of Austin, Tex.

[73] Assignee: Motorola, Inc., Schaumburg, Ill.

[21] Appl. No.: 640,458

[22] Filed: Jan. 11, 1991

[51] Int. Cl.$^5$ .......................................... H01L 21/225
[52] U.S. Cl. ..................................... 437/162; 437/46; 437/950; 148/DIG. 35; 148/DIG. 34
[58] Field of Search ............... 437/160, 950, 913, 934, 437/161, 162, 46; 148/DIG. 34, DIG. 35, DIG. 144

[56] References Cited

U.S. PATENT DOCUMENTS 4,676,847  6/1987  Lin ................................. 148/DIG. 35
4,996,168  2/1991  Ozaki et al. ......................... 437/160

FOREIGN PATENT DOCUMENTS 0091570  8/1978  Japan .................................. 437/160
0268023  10/1989  Japan .................................. 437/160

Primary Examiner—Brian E. Hearn
Assistant Examiner—C. Chaudhari
Attorney, Agent, or Firm—Jasper W. Dockrey

[57] ABSTRACT

A semiconductor device is formed by a process in which a diffusant penetration layer and a diffusant source layer containing a boron dopant are formed overlaying the surface of a semiconductor substrate. The diffusant source layer is annealed to cause the boron dopant to controllably diffuse through the diffusant penetration layer to the semiconductor substrate to form a doped region at the surface. The diffusant source layer and the diffusant penetration layer are removed and a gate insulator is formed on the substrate surface overlaying the doped region. An N doped gate electrode is then formed overlaying the gate insulator.

15 Claims, 2 Drawing Sheets

SEMICONDUCTOR DEVICE PROCESS USING DIFFUSANT PENETRATION AND SOURCE LAYERS FOR SHALLOW REGIONS

FIELD OF THE INVENTION

This invention relates generally to a process for fabricating semiconductor devices, and more specifically to a process for fabricating devices which include shallow boron doped regions.

BACKGROUND OF THE INVENTION

One of the foremost semiconductor technologies is the CMOS technology, and especially the Silicon Gate CMOS Technology. The most common way to implement this technology is to use N+ doped polycrystalline silicon for the gate electrode of both the N-Channel device and P-Channel device. Use of the N+ doped material for the gate electrode of the P-Channel device, however, requires counter doping of the channel region of that device in order to adjust the threshold voltage to a low enough value to be useful in most circuits. The resulting P-Channel device is known as a buried channel device.

As the physical dimensions of the MOS transistor continue to be reduced in order to meet the requirements for submicron and even sub-half micron CMOS technologies, the use of N+ doped poly crystalline silicon as the gate electrode for the P-Channel device begins to cause serious problems. The resulting P-Channel device suffers from seriously degraded short channel behavior because of the presence of the buried channel. Alternate technologies have been advanced to overcome this problem, such as using mid-gap refractory gate electrodes, dual N+/P+ polycrystalline silicon gate electrodes, or modified polycrystalline silicon gate work function using polycrystalline silicon doped with germanium, and the like. Although these alternate process technologies result in useful transistor designs, the N+ polycrystalline silicon gate electrode process continues to be the favored process because of its relative process simplicity and maturity. The favored process requires a shallow doped region of carefully controlled dopant concentration to achieve a device having a desired and controllable threshold voltage. Attempts to achieve such a shallow doped region have included the use of amorphizing implants before channel doping and implantation of BF$_2$ through the gate oxide. The former causes damage to the substrate in the channel region which can adversely affect transistor characteristics because of mobility degradation and the increase in surface state density. The latter cause gate oxide and hot carrier reliability problems.

Accordingly, a need existed for an improved process for fabricating semiconductor devices which would overcome the deficiencies of the prior art process technologies and still maintain the processing simplicity of the N+ polycrystalline silicon gate process.

SUMMARY OF THE INVENTION

The invention provides an improved process for fabricating a semiconductor device which overcomes the problems of the prior art. In accordance with the invention a semiconductor substrate is provided which has a diffusant penetration layer overlaying the surface. A diffusant source layer containing a boron dopant is formed overlaying the diffusant penetration layer. The diffusant source layer is annealed to cause the boron dopant to controllably diffuse through the diffusant penetration layer and into the semiconductor substrate to form a shallow doped region. The diffusant source layer and diffusant penetration layer are removed and a gate insulator is formed on the substrate surface overlaying the shallow doped region. A gate electrode doped with N type conductivity determining dopant impurities is then formed overlaying the gate insulator.

DESCRIPTION OF A PREFERRED EMBODIMENT

FIGS. 1-6 illustrate, in cross section, process steps in accordance with the invention for the fabrication of a P-Channel MOS transistor. Although the invention is described and illustrated with reference to this one particular type of device, it is applicable to other semiconductor devices, especially to CMOS devices.

Figure 1:
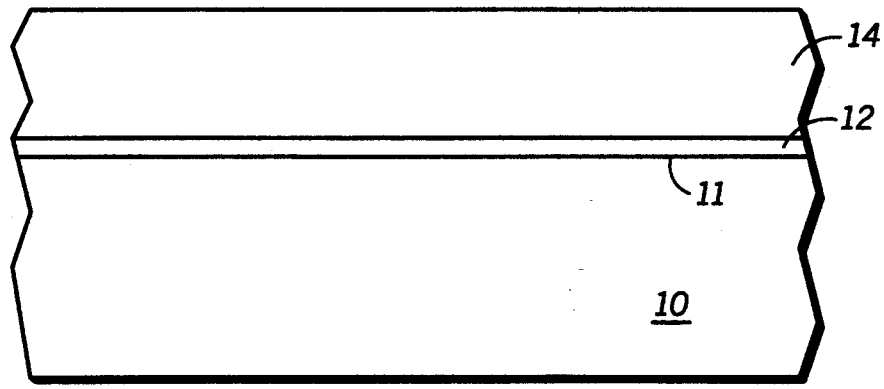
FIGS. 1-6 illustrate, in cross section, process steps in accordance with the invention for forming a portion of a semiconductor device.

FIG. 1 illustrates initial steps in accordance with the invention. In accordance with this illustrative example, a silicon semiconductor substrate 10 of N-type conductivity is provided. Substrate 10 may be a bulk wafer or may also be a portion of a bulk wafer such as an N-type well within a host wafer. Preferably substrate 10 has a surface concentration of about $2 \times 10^{17}$ cm$^{-3}$. A diffusant penetration layer 12 is formed on surface 11 of substrate 10. A diffusant source layer 14 is formed overlaying the diffusant penetration layer 12. It has been determined that a very shallow and very well controlled boron doped layer can be formed in substrate 10 by allowing the dopant from a source layer to penetrate through a diffusant penetration layer under carefully controlled conditions. Dopant penetration layer 12 is preferably a layer of silicon oxide having a thickness of about 10-15 nanometers and more preferably having a thickness of about 12.5 nanometers. The penetration layer can be performed from a deposited silicon oxide or can be thermally grown by the oxidation of substrate 10.

Diffusant source layer 14 is preferably a layer of amorphous or polycrystalline silicon (hereinafter collectively called polycrystalline silicon) which is deposited by chemical vapor deposition in an undoped state and is subsequently implanted with a dopant impurity as indicated by arrows 16. Preferably layer 14 is polycrystalline silicon having a thickness of 50-200 nanometers which is subsequently doped by the implantation of BF$_2$ ions to a dose of about $5 \times 15$ cm$^{-2}$. The implantation is done at an energy of about 25-60 keV so that the majority of the implanted ions reside in polycrystalline silicon layer 14.

Figure 2:
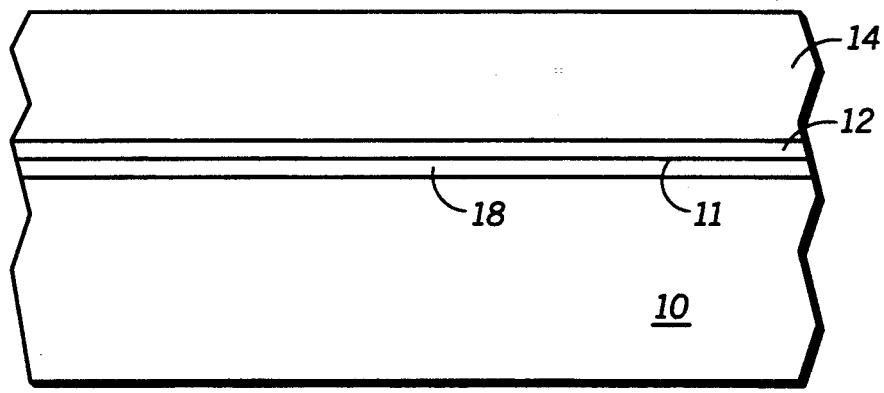

As illustrated in FIG. 2, the process continues by annealing diffusant source layer 14 to cause the diffusion of the dopant material in that layer through penetration layer 12 and into substrate 10, forming a shallow doped region 18 at the surface 11 of substrate 10. The anneal is preferably about 15-30 minutes at 900° C. in nitrogen to form doped region 18 having a peak concentration of about $5 \times 10^{17} - 1 \times 10^{19}$ cm$^{-2}$ and having a junction depth less than about 40-50 nanometers.

Figure 3:
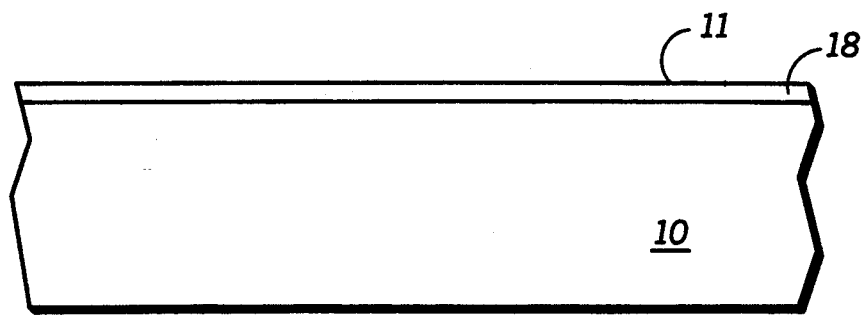
Figure 4:
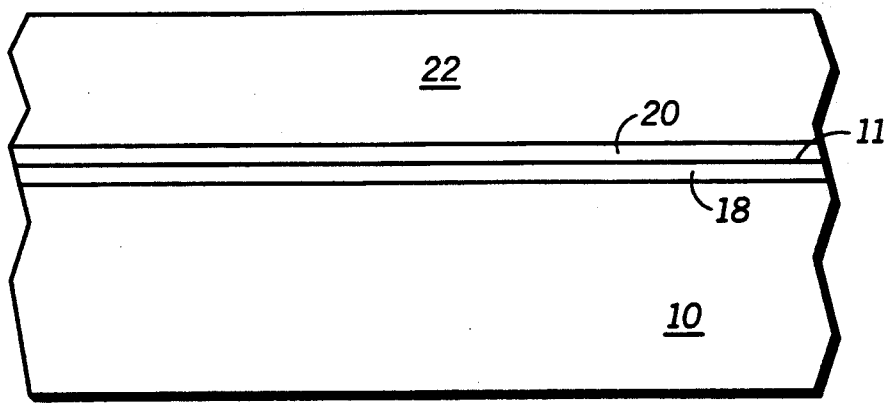

The process continues, as illustrated in FIG. 3, by removing the diffusant penetration layer 12 and diffusant source layer 14. The resulting structure includes shallow doped region 18 at surface 11 of substrate 10. Doped region 18 is thus a shallow P doped region at the surface of what will become the channel of the P-Channel MOS transistor.

Figure 5:
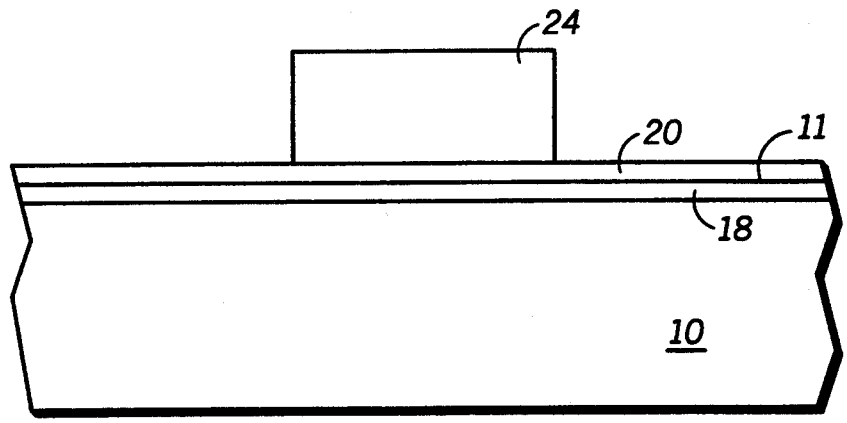

The process continues with the formation of a gate oxide layer 20 overlaying surface 11. Gate oxide layer 20 can be formed by chemical vapor deposition or by thermal growth and preferably has a thickness of less than about 10 nanometers, and more preferably has a thickness of about 7.5 nanometers. The gate oxide, if thermally grown, is preferably done at a low temperature such as 800° C. in dry oxygen. Optionally, the thermal oxidation may be done with the addition to the ambient of up to about 10% HCl to enhance the growth rate of the oxide. Low temperatures are maintained in this and subsequent processing steps to minimize the thermal diffusion of the dopant material in doped region 18. A layer 22 of polycrystalline silicon is then deposited on gate oxide layer 20 as illustrated in FIG. 5. Polycrystalline silicon layer 22 is preferably doped, either insitu with N-type doping impurities or is deposited undoped and is subsequently doped by ion implantation with N-type conductivity determining dopant ions.

The N-doped polycrystalline silicon layer 22 is then patterned using conventional photolithography techniques to form a gate electrode 24 as illustrated in FIG. 5. Gate electrode 24 overlays gate oxide 20 which, in turn, overlays the shallow boron doped channel region 18 at the surface of substrate 10.

Figure 6:
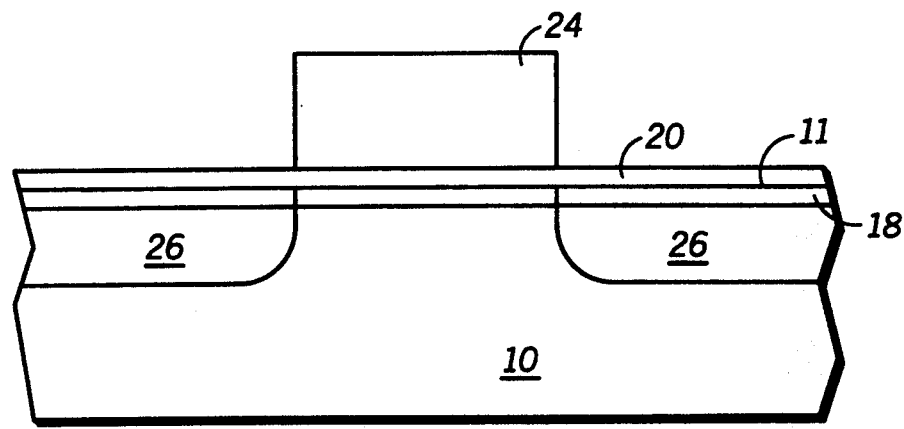

The process continues as illustrated in FIG. 6 with the formation of P-doped source and drain regions 26 which are aligned with gate electrode 24. The source and drain regions are formed in conventional manners such as by ion implantation of boron ions. In a preferred embodiment (not illustrated) the complete formation of the source and drain regions includes both the formation of a lightly doped boron region self-aligned with gate electrode 24 and the formation of a more heavily doped region spaced apart from the gate electrode using sidewall spacers at the edges of the gate electrode to cause the desired spacing. The formation of such a lightly doped drain (LDD) structure is well known in the art.

In the implementation of the invention the thickness of the diffusant penetration layer is important to the control of the thickness and doping concentration in the resulting doped region formed in the underlying silicon substrate. It has been found that the control of this layer is very difficult if the penetration layer has a thickness of less than about 8 nanometers. In submicron, and especially sub-half micron devices, however, it is desirable to have a gate insulator having a thickness less than about 8 nanometers. Therefore, in accordance with the invention, the shallow channel region having carefully controlled doping is achieved by controlled diffusion through a thicker diffusant penetration layer which is then removed to form the thinner desired gate oxide. The upper limit on the thickness of the diffusant penetration layer is about 15 nanometers, above which it is difficult to achieve the desired shallow, relatively high concentration doped layer. Devices formed in accordance with the invention exhibit stable threshold voltage shifts ranging from 200 mV to over 4 V and reduced effects of drain induced barrier lowering. In addition, practice of the invention avoids substrate damage and fluorine or boron incorporation in the gate oxide that is undesirable, but is common with other attempted solutions.

It is thus apparent that there has been provided, in accordance with the invention, an improved process for fabricating a semiconductor device having a shallow, controlled doped region at the semiconductor substrate surface. The invention has been illustrated by reference to a preferred embodiment in which a P-Channel MOS transistor is fabricated. The invention is not, however, limited to such an illustrative embodiment. Those skilled in the art will recognize that the invention is applicable to other semiconductor devices. In addition, those skilled in the art will recognize that other variations and modifications are possible without departing from the spirit of the invention. For example, the thickness and doping level of the diffusant source layer can be modified to achieve a particular doping level. In addition, a capping layer such as a layer of silicon oxide or layers of silicon oxide and silicon nitride can be provided overlaying the diffusant source layer in order to prevent out diffusion of the dopant material during the anneal cycle. Other conventional processing steps besides those illustrated may, of course, be used in the fabrication of the completed semiconductor device. Such steps include, for example, isolation between devices, device metallization, passivation, and the like. It is therefor intended that the invention encompass all such variations, modifications, and additional steps as may fall within the scope of the appended claims.

We claim:

1. A process for fabricating a semiconductor device comprising the steps of:
   providing a semiconductor substrate having a surface;
   forming a first oxide layer of a first predetermined thickness on a selected portion of the substrate surface;
   forming a first layer of polycrystalline silicon doped with boron dopant impurities overlaying the first oxide layer;
   annealing the first layer of polycrystalline silicon to cause a portion of the boron dopant impurities to diffuse through the oxide layer and into the semiconductor substrate to form a doped region in the semiconductor substrate;
   removing the first layer of polycrystalline silicon and the first oxide layer;
   forming a second oxide layer of a second predetermined thickness on the selected portion of the substrate surface overlaying the doped region, the second predetermined thickness being substantially less than the first predetermined thickness;
   depositing a second layer of polycrystalline silicon on the second insulating layer.

2. The process of claim 1 wherein the semiconductor substrate is of N type conductivity and wherein the step of forming the first layer of polycrystalline silicon comprises the steps of: depositing a layer of undoped polycrystalline silicon; and implanting the layer of undoped polycrystalline silicon with boron containing ions.

3. The process of claim 2 further comprising the step of: doping the second layer of polycrystalline silicon with N type dopant impurities.

4. The process of claim 3 further comprising the steps of: patterning the second layer of polycrystalline silicon to form a gate electrode overlaying the doped region; and forming P type source and drain regions in the semiconductor substrate in alignment with the gate electrode.

5. The process of claim 2 wherein the step of implanting comprises implanting with $BF_2$ ions.

6. The process of claim 1 wherein the step of forming a first oxide layer comprises forming a silicon oxide layer having a thickness of about 10–15 nanometers.

7. The process of claim 6 wherein the step of forming a silicon oxide layer comprises chemical vapor depositing a silicon dioxide layer.

8. The process of claim 1 wherein the step of forming a second insulating layer comprises the step of growing a thermal silicon dioxide layer by rapid thermal oxidation.

9. The process of claim 1 wherein the step of forming a second insulating layer comprises the step of depositing silicon oxide by low pressure chemical vapor deposition.

10. The process of claim 1 further comprising the steps of: forming a capping layer of oxide overlaying the first layer of polycrystalline silicon; and forming a layer of silicon nitride overlaying the layer of capping oxide.

11. A process for fabricating a P channel MOS transistor comprising the steps of:
   providing a semiconductor substrate having a surface region of N type conductivity;
   forming a first oxide layer having a thickness of about 10–15 nanometers overlying the surface region;
   forming an undoped first layer of polycrystalline silicon overlaying the first oxide layer;
   ion implanting the first layer of polycrystalline silicon with boron containing dopant impurities;
   annealing the first layer of polycrystalline silicon to cause a portion of the boron dopant impurities to diffuse through the oxide layer and into the semiconductor substrate;
   removing the first layer of polycrystalline silicon and the first oxide layer;
   forming a gate insulator layer a predetermined thickness on the surface region, the predetermined thickness being substantially less than 10–15 nanometers;
   forming an N type polycrystalline silicon gate electrode overlying the gate insulator; and
   forming P type source and drain regions in the surface region aligned to the gate electrode.

12. A process for fabricating a semiconductor device comprising the steps of:
   providing a semiconductor substrate having a surface;
   forming a diffusant penetration layer of a first predetermined thickness overlying surface;
   forming a diffusant source layer containing boron dopant overlaying the diffusant penetration layer;
   annealing the diffusant source layer to cause the boron dopant to controllably diffuse through the diffusant penetration layer and to the semiconductor substrate to form a doped region at the surface;
   removing the diffusant source layer and the diffusant penetration layer;
   forming a gate insulator of a second predetermined thickness on the surface overlying the doped region, the second predetermined thickness being substantially less than the first predetermined thickness; and
   forming a gate electrode doped with N type conductivity determining dopant impurities overlaying the gate insulator.

13. The process of claim 12 wherein the step of forming a diffusant source layer comprises the step of forming a layer of doped polycrystalline silicon.

14. The process of claim 13 wherein the step of forming a layer of doped polycrystalline silicon comprises the steps of:
   depositing a layer of undoped polycrystalline silicon; and
   ion implanting the undoped polycrystalline silicon with boron containing ions.

15. The process of claim 14 wherein the step of ion implanting comprises ion implanting at an energy such that the range of the boron containing ions is within the layer of undoped polycrystalline silicon.

* * * * *